United States Patent [19]

Kraehe

[11] Patent Number: 5,776,847
[45] Date of Patent: Jul. 7, 1998

[54] STABILIZED VAPOUR-DEPOSITION MATERIALS BASED ON TITANIUM OXIDE

[75] Inventor: Karl-Friedrich Kraehe, Darmstadt, Germany

[73] Assignee: Merck Patent Gesellschaft mit Beschrankter Haftung, Germany

[21] Appl. No.: 808,434

[22] Filed: Feb. 28, 1997

[30] Foreign Application Priority Data

Mar. 1, 1996 [DE] Germany ............ 196 07 833.4

[51] Int. Cl.$^6$ ............................. C04B 35/28
[52] U.S. Cl. ............ 501/134; 501/103; 423/608; 423/609; 106/436; 106/438
[58] Field of Search ................. 106/436, 438; 423/608, 609; 501/103, 134

[56] References Cited

U.S. PATENT DOCUMENTS

| 4,422,917 | 12/1983 | Hayfield | 423/609 |
|---|---|---|---|
| 4,912,286 | 3/1990 | Clarke | 174/110 A |
| 5,173,215 | 12/1992 | Clarke | 423/609 |
| 5,225,382 | 7/1993 | Mizuno et al. | 423/609 |
| 5,281,496 | 1/1994 | Clarke | 423/609 |
| 5,320,782 | 6/1994 | Okuda et al. | 423/609 |

FOREIGN PATENT DOCUMENTS

| 7-233469 | 2/1994 | Japan . |
| 2 281 741 | 3/1995 | United Kingdom . |

*Primary Examiner*—Deborah Jones
*Attorney, Agent, or Firm*—Millen, White, Zelano & Branigan, P.C.

[57] ABSTRACT

The application relates to stabilized vapor-deposition materials based on titanium oxide. These materials contain, as stabilizing additive, an oxide from the group consisting of zirconium oxide, hafnium oxide, yttrium oxide and ytterbium oxide.

7 Claims, No Drawings

STABILIZED VAPOUR-DEPOSITION MATERIALS BASED ON TITANIUM OXIDE

BACKGROUND OF THE INVENTION

The application relates to stabilized vapour-deposition materials based on titanium oxide.

It is widespread prior art to provide the surfaces of optical components with thin coatings for their protection or in order to obtain certain functional properties. Optical components of this kind are essentially to be understood as meaning optical lenses, spectacle lenses, and lenses for cameras, field glasses or for other optical apparatus, beam splitters, prisms, mirrors, window-panes, etc. On the one hand, the aim of such coatings is to upgrade the surfaces of optical substrates such that, by means of hardening and/or by increasing the chemical resistance, damage caused by mechanical, chemical or environmental influences is avoided. This is particularly significant in the case of substrates comprising plastics materials. On the other hand, surface coatings are employed in order to reduce reflection, especially in the case of spectacle lenses and other lenses. In this context it is possible, given an appropriate choice of the coating materials, layer thickness, single- or multilayer construction comprising, if appropriate, different materials with differing refractive indices, to achieve a reduction in the reflection to less than 1% over the entire visible spectrum of radiation.

Upgrading or antireflection layers of this kind are produced using numerous oxide materials, for instance $SiO_2$, $TiO_2$, $ZrO_2$, MgO, $Al_2O_3$, and also fluorides such as $MgF_2$, and mixtures of these substances. Optical substrates are usually coated by the high-vacuum vapour-deposition technique. In this procedure, the substrate and a charge containing the substance to be applied by vapour-deposition are placed inside an appropriate high-vacuum vapour-deposition apparatus, which is then evacuated, and the substance is subsequently caused to vaporize by heating and/or by means of electron beams, and is deposited on the surface of the substrate as a thin layer. Appropriate apparatus and methods are common prior art.

Titanium oxide is the most frequently employed substance for the production of thin layers of high refractive index by high-vacuum vapour deposition. Titanium oxide layers are transparent in the visible range and in the near infrared spectral range from about 360 nm to 12 µm. The refractive index is about 2.4 at 500 nm. For this reason, layers of titanium oxide are employed for many types of layers, for example, for filters, beam splitters, reflectors, polarizers and anti-reflection layers.

Titanium oxide layers can be produced by vaporization of titanium(IV) oxide, titanium(III) oxide and titanium(II) oxide. A particularly advantageous oxide is that having the composition $TiO_{1.7}$. This oxide already possesses the composition only attained by the melt of other titanium oxides after relatively long vaporization. Especially when titanium (IV) oxide is used, a time-consuming pre-melting process is necessary in order to obtain a melt of stable composition.

The titanium oxide of stoichiometry $TiO_{1.7}$ consists, according to X-ray analysis, of a mixture of $Ti_3O_5$ and $Ti_4O_7$.

The form most favourable for use in the vapour-deposition technique is different depending on the application. In most cases granules, tablets or pellets are employed. Substances present in powder form are less favourable since, when used, there is often splashing in the course of heating up and melting down.

The suboxides of titanium, where the latter has a valency lower than IV, are prepared in accordance with the prior art from homogenized mixtures of titanium(IV) oxide and titanium powder of the appropriate composition by sintering the mixtures under a high vacuum. The sintering temperatures are from about 1300° to 1700° C. The residual pressure during the sintering process is below $10^{-3}$ mbar. The form of the materials is produced prior to sintering by means of tabletting, granulation or pelletizing. In the sintering process, the components react to form the respective suboxide. Titanium suboxides suitable for use as vapour-deposition material possess a stoichiometric composition corresponding to $TiO_x$ where x=1.5 to 1.7.

In the case of production by this technique it is found, however, that the granules, tablets or pellets are very brittle and are easily destroyed under mechanical stress, for example in the course of packing, transportation and introduction into the vaporizing crucible, forming a relatively large quantity of very fine powder. This powder disrupts the vapour-deposition process in that it leads to splashing in the course of melting down and in the course of vaporization, and these splashes may get onto the parts to be coated, such as panes, lenses or prisms, and render them unusable.

Another disadvantage of the low mechanical stability of the titanium oxides is that their breakdown into powder considerably reduces the yield in the production process. It has been found from experience that the production of $TiO_{1.7}$ is accompanied by the formation of up to 25% of fine powder wastes which are unusable in the vapour-deposition technique.

In order to reduce or to eliminate this disadvantage it is possible to try to increase the hardness or durability of the granules, tablets or pellets.

One possibility consists in raising the durability by an appropriate choice of the conditions during the sintering process. However, it is found that durable granules, tablets or pellets can only be produced if the sintering temperature is relatively low. Under these conditions, however, the reaction to the suboxide is incomplete, with the result that residues of the starting materials $TiO_2$ or Ti are still present. In the course of melting down and vaporization in the vapour-deposition apparatus, severe splashing occurs, so that the material is unusable. For the production of material which does not splash in the course of melting down and vaporization it is necessary to observe a minimum temperature above which, however, the granules, tablets or pellets become fragile. If the sintering temperature is raised further, the granules, tablets or pellets may even be destroyed in the sintering process.

Moreover, the attempt to improve the durability of the granules, tablets or pellets by increasing the hardness in the course of tabletting, granulation or pelletizing is unsuccessful. In fact, the granules, tablets or pellets again become brittle and unstable in the course of the sintering operation. This effect comes about because the crystallites of the suboxides grow to a size of from 0.01 to 0.1 mm during the sintering operation, disrupting the cohesion of the crystallites.

SUMMARY OF THE INVENTION

The object of the invention was therefore to improve the structure of the materials by means of an additive.

Only inorganic additives are suitable. Organic binders are destroyed and vaporized in the course of the sintering process and are therefore unsuitable for the stabilization. Inorganic additives remain in the material. They are therefore to be selected such that, while improving the hardness and durability of the product, they do not impair the other properties. Particular care should be taken that the optical properties of the layers are not altered, especially the refractive index and transmission range, and that there is no adverse effect on the vaporization behaviour, especially by any gaseous escape and splashing in the course of melting down and vaporization.

Furthermore, in the course of vaporization, the additive should not accumulate or become depleted in the melt but should vaporize in congruence with the titanium oxide. Otherwise, the composition of the vaporization material alters in the course of vaporization, and the optical properties of the vapour-deposition layers are not constant and/or not reproducible.

Extensive experiments have revealed that a relatively large number of oxides, for instance those of calcium, magnesium, aluminium, silicone, niobium, tantalum, cerium, praseodymium, vanadium, chromium and iron are unsuitable as stabilizing additives owing to inadequate stabilizing effect, incongruent vaporization, gas emission in the course of melting down, or absorption in the visible to ultraviolet spectral range.

It has surprisingly now been found that oxides from the group consisting of zirconium oxide, hafnium oxide, yttrium oxide and ytterbium oxide are ideally suited as stabilizing additives for sintered vapour-deposition materials based on titanium oxide.

The invention therefore relates to the use of the oxides from the group consisting of zirconium oxide, hafnium oxide, yttrium oxide and ytterbium oxide as stabilizing additives to sintered vapour-deposition materials based on titanium oxide.

The invention additionally relates to sintered vapour-deposition materials based on titanium oxide which have been stabilized in this way.

The invention relates, furthermore, to a process for the preparation of such stabilized vapour-deposition materials, in which a finely divided mixture of titanium oxide and an oxide serving as stabilizer is sintered under a high vacuum.

In the novel stabilized sintered vapour-deposition materials based on titanium oxide, the titanium oxide has the composition $TiO_x$ where $x=1.4$ to $1.8$. In accordance with the invention, the vapour-deposition materials contain from 0.1 to 10% by weight of an oxide from the group consisting of zirconium oxide ($ZrO_2$), hafnium oxide ($HfO_2$), yttrium oxide ($Y_2O_3$) and ytterbium oxide ($Yb_2O_3$) as stabilizing additive in homogeneous distribution. Preferably, from 0.5 to 5% by weight and, in particular, about 2.5% by weight of these oxides is present in the vapour-deposition materials. Preferred vapour-deposition materials contain titanium oxide of the composition $TiO_x$ where $x=1.5$ to $1.7$, with $x=1.7$ being particularly preferred. Of the oxides to be employed as stabilizing additive, zirconium oxide ($ZrO_2$) is particularly preferred.

It has been found that the addition of the above-mentioned oxides brings about an unexpected mechanical stabilization of sintered products based on titanium oxide. Thus, in the sintering of corresponding shaped articles, such as granules, tablets or pellets, at temperatures which bring about reaction to form titanium suboxides of uniform and stable stoichiometric composition, there is no longer decomposition of the sintered products. Moreover, the sintered articles are hard and possess long-term stability to mechanical stress. In the course of subsequent handling as vapour-deposition material, for instance in the course of packaging, storage and transportation and in the course of use in the vapour-deposition process, there is no fragmentation or abrasion of fine powder.

The vapour-deposition material stabilized in accordance with the invention is prepared analogously to titanium oxide vapour-deposition materials known per se. The only difference is that the appropriate amount of oxide acting as stabilizer is added to the initial mixture. Specifically, a finely divided homogeneous mixture of titanium oxide or titanium oxides and/or metallic titanium is first of all prepared, the composition being selected such that it corresponds to $TiO_x$ where $x=1.4$ to $1.8$, and from 0.1 to 10% by weight of an oxide from the group consisting of zirconium oxide, hafnium oxide, yttrium oxide and ytterbium oxide. This mixture is processed by a customary technique, by granulation, pelletizing or tableting, to form appropriate shaped articles. These are then sintered under a high vacuum at temperatures of between 1300° and 1700° C. The duration of sintering, depending on the chosen temperature, can be between 12 and 48 hours. Sintering at 1500° C. over 24 hours is favourable.

In the production process and in the course of subsequent handling of the vapour-deposition material stabilized in accordance with the invention, a fine fraction of less than 1% is found. In comparison, in the case of non-stabilized material, there is a fine fraction of in general about 20% even in the production process.

The vapour-deposition materials stabilized in accordance with the invention are advantageously to be used in complete analogy to customary titanium oxide vapour-deposition materials in the production of thin layers in the high-vacuum vapour-deposition technique. In the course of melting down and vaporization there is no splashing or gaseous escape. In addition it is found that the oxides present as stabilizing additive do not accumulate in the residual melt. This means that the material is vaporized congruently, i.e. with constant composition. Accordingly, the layers produced are constant and reproducible in their composition and, as a result, in their properties, for instance refractive index. This is important if it is necessary to add new material to a melt or if it is intended to produce a number of layers in succession from one melt.

The layers produced from the novel vapour-deposition materials show no measurable absorption in the spectral range from 360 nm to about 5 µm.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire disclosures of all applications, patents and publications, cited above and below, and of corresponding application German 196 07 833.4, filed Mar. 1, 1996, are hereby incorporated by reference.

EXAMPLE 1

A homogeneous finely divided mixture consisting of 89.53% titanium dioxide, 9.47% titanium and 1% zirconium oxide is granulated and is sintered under reduced pressure at a residual pressure of below $1-10^{-3}$ mbar. The sintering temperature is 1500° C. and the duration of sintering is 24 hours.

The sintered granules obtained are hard and durable. In the course of removal from the apparatus, packaging and use in the vapour-deposition apparatus, only very small quantities of fine fractions are formed (below 1%).

EXAMPLE 2

A mixture consisting of 88.625% titanium dioxide, 9.375% titanium and 2% zirconium oxide is granulated and sintered under reduced pressure at a residual pressure of below $1-10^{-3}$ mbar. The sintering temperature is 1500° C., and the duration of sintering is 24 hours.

This mixture too gives hard and durable granules.

EXAMPLE 3
Layer production

In a commercial vapour-deposition apparatus (A700Q from Leybold, Hanau) a water-cooled copper crucible of the electron-beam vaporizer device is filled with material according to Example 1. Cleaned quartz-glass substrates are fastened on the substrate mounting device. The apparatus is sealed and evacuated to a pressure of below $1-10^{-5}$ mbar. The substrates are heated to about 300° C. Using a gas inlet device, oxygen is passed in up to a pressure of about $2-10^{-4}$ mbar. The vapour-deposition material is slowly heated and melted down under a shutter screen. The screen is opened and the titanium oxide is vapour-deposited onto the substrates at a rate of 0.2 nm/s until the desired layer thickness has been reached. The layers produced in this way are transparent in the spectral range from 380 nm to more than 5 μ. The refractive index of 500 nm is about 2.2.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. Stabilized sintered vapor-deposition materials, based on titanium oxide, having the general formula $TiO_x$ where $x=1.4$ to 1.8, and containing from 0.1 to 10% by weight of an oxide selected from the group consisting of zirconium oxide, hafnium oxide, yttrium oxide and ytterbium oxide.

2. Vapor-deposition materials according to claim 1, which contain from 0.5 to 5% by weight of oxides from the group consisting of zirconium oxide, hafnium oxide, yttrium oxide and ytterbium oxide.

3. Vapor-deposition materials according to claim 1, which titanium oxide has the composition $TiO_x$ where $x=1.5$ to 1.7.

4. Process for the preparation of stabilized vapor-deposition materials according to claim 1, wherein a finely divided mixture of titanium oxides and/or metallic titanium having a stoichiometic composition corresponding to $TiO_x$ where $x=1.4$ to 1.8 to 10% by weight of an oxide from the group consisting of zirconium oxide, hafnium oxide, yttrium oxide and ytterbium oxide under a high vacuum at temperatures of between 1300° and 1700° C.

5. In a method for preparing sintered vapor-deposited material based on oxide, wherein a mixture comprising titanium oxide, titanium metal or both is sintered, the improvement comprising adding an oxide selected from the group consisting of zirconium oxide, hafnium oxide, yttrium oxide and ytterbium oxide to said mixture comprising titanium oxide, titanium metal or both prior to sintering in an amount sufficient to stabilize said sintered vapor-deposition materials based on titanium oxide.

6. Vapor-deposition materials according to claim 1, which contain about 2.5% by weight of oxides from the group consisting of zirconium oxide, hafnium oxide, yttrium oxide and ytterbium oxide.

7. Vapor-deposition materials according to claim 1, wherein the titanium oxide has the composition $TiO_x$ where $x=1.7$.

* * * * *